US007828047B2

(12) United States Patent
Miyazaki et al.

(10) Patent No.: US 7,828,047 B2
(45) Date of Patent: Nov. 9, 2010

(54) COOLING UNIT

(75) Inventors: Ryuuji Miyazaki, Kawasaki (JP);
Masumi Suzuki, Kawasaki (JP);
Minoru Hirano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 205 days.

(21) Appl. No.: 12/003,542

(22) Filed: Dec. 28, 2007

(65) Prior Publication Data

US 2008/0236797 A1 Oct. 2, 2008

Related U.S. Application Data

(62) Division of application No. 10/407,464, filed on Apr. 7, 2003, now Pat. No. 7,337,829, which is a division of application No. 09/548,426, filed on Apr. 12, 2000, now Pat. No. 6,564,861.

(30) Foreign Application Priority Data

Sep. 3, 1999 (JP) ................. 11-250796

(51) Int. Cl.
*F28D 15/00* (2006.01)
(52) U.S. Cl. ................. 165/104.29
(58) Field of Classification Search ............ 165/104.29, 165/104.28, 104.26; 62/513, 515
See application file for complete search history.

(56) References Cited

U.S. PATENT DOCUMENTS

| 3,609,991 | A | 10/1971 | Chu et al. |
| 3,985,182 | A | 10/1976 | Hara et al. |
| 3,989,099 | A | 11/1976 | Hosono et al. |
| 4,020,399 | A | 4/1977 | Suzuki et al. |
| 4,106,557 | A | 8/1978 | Sonobe et al. |
| 4,291,758 | A | 9/1981 | Fujii et al. |
| 4,330,033 | A | 5/1982 | Okada et al. |
| 4,583,378 | A | 4/1986 | Sakamoto et al. |
| 4,625,790 | A | 12/1986 | Okayasu |
| 5,106,451 | A | 4/1992 | Kan et al. |
| 5,203,399 | A | 4/1993 | Koizumi |
| 5,219,020 | A | 6/1993 | Akachi |

(Continued)

FOREIGN PATENT DOCUMENTS

EP 0 298 372 1/1989

(Continued)

OTHER PUBLICATIONS

Japanese Office Action JP 11-250796 dated Feb. 6, 2007.

*Primary Examiner*—Melvin Jones
(74) *Attorney, Agent, or Firm*—Westerman, Hattori, Daniels & Adrian, LLP

(57) ABSTRACT

A cooling unit has a heat receiving unit that receives heat from a body radiating heat; a radiator disposed at a distance from the heat receiving unit and radiating recovered heat; a liquid coolant transporting heat generated at the heat receiving unit to the radiator; and a hollow tube disposed so that the liquid coolant circulates between the heat receiving unit and the radiator, a circulating flow of the liquid coolant formed by an elevating force of air bubbles generated from the heat received at the heat receiving unit, the radiator having an air pocket forming one part of the circulation path of the liquid coolant together with the hollow tube and capable of collecting the air bubbles.

6 Claims, 12 Drawing Sheets

U.S. PATENT DOCUMENTS

| | | | |
|---|---|---|---|
| 5,285,347 | A | 2/1994 | Fox et al. |
| 5,289,869 | A | 3/1994 | Klein et al. |
| 5,394,936 | A | 3/1995 | Budelman |
| 5,458,189 | A | 10/1995 | Larson et al. |
| 5,606,341 | A | 2/1997 | Aguilera |
| 5,634,351 | A | 6/1997 | Larson et al. |
| 5,764,483 | A | 6/1998 | Ohashi et al. |
| 5,871,043 | A | 2/1999 | Osakabe et al. |
| 5,966,957 | A | 10/1999 | Malhammar et al. |
| 6,005,772 | A | 12/1999 | Terao et al. |
| 6,070,654 | A | 6/2000 | Ito |
| 6,104,611 | A | 8/2000 | Glover et al. |
| 6,173,761 | B1 | 1/2001 | Chandratilleke et al. |
| 6,269,865 | B1 | 8/2001 | Huang |
| 6,564,861 | B1 * | 5/2003 | Miyazaki et al. ....... 165/104.29 |
| 6,820,683 | B1 | 11/2004 | Hao |
| 7,337,829 | B2 * | 3/2008 | Miyazaki et al. ....... 165/104.29 |

FOREIGN PATENT DOCUMENTS

| | | |
|---|---|---|
| EP | 0 456 508 | 11/1991 |
| FR | 2547906 | 12/1984 |
| GB | 1028363 | 5/1966 |
| GB | 2 225 099 A | 5/1990 |
| JP | 54-128286 | 10/1979 |
| JP | JA 0128286 | 10/1979 |
| JP | 55-63397 A | 5/1980 |
| JP | 56-129397 A | 10/1981 |
| JP | 59-94445 | 5/1984 |
| JP | 2-122554 A | 5/1990 |
| JP | 4-20788 A | 1/1992 |
| JP | 7-127982 | 5/1995 |
| JP | 9-246441 | 9/1997 |
| JP | 10-173115 A | 6/1998 |
| JP | 11-502300 A | 2/1999 |

* cited by examiner

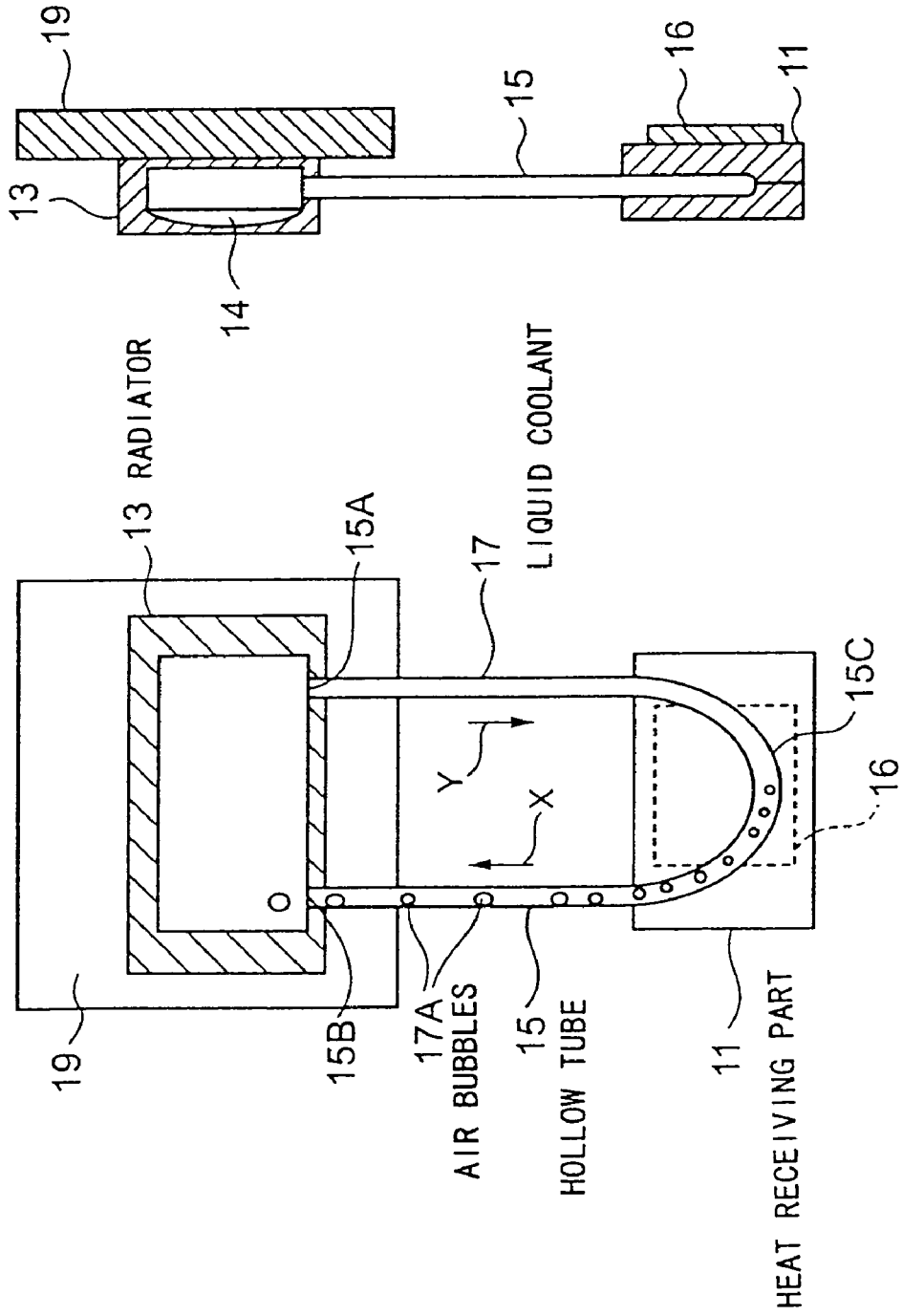

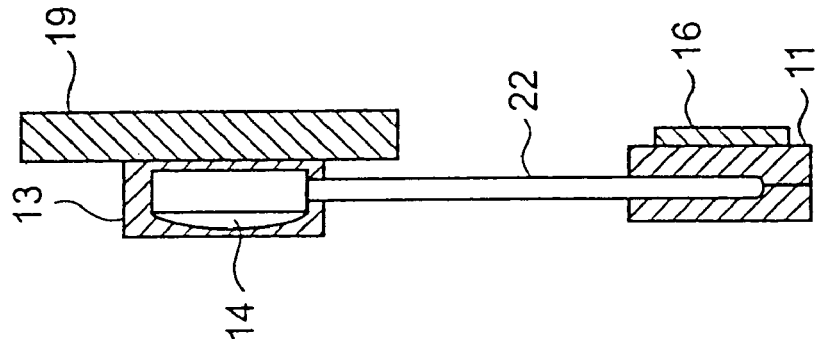
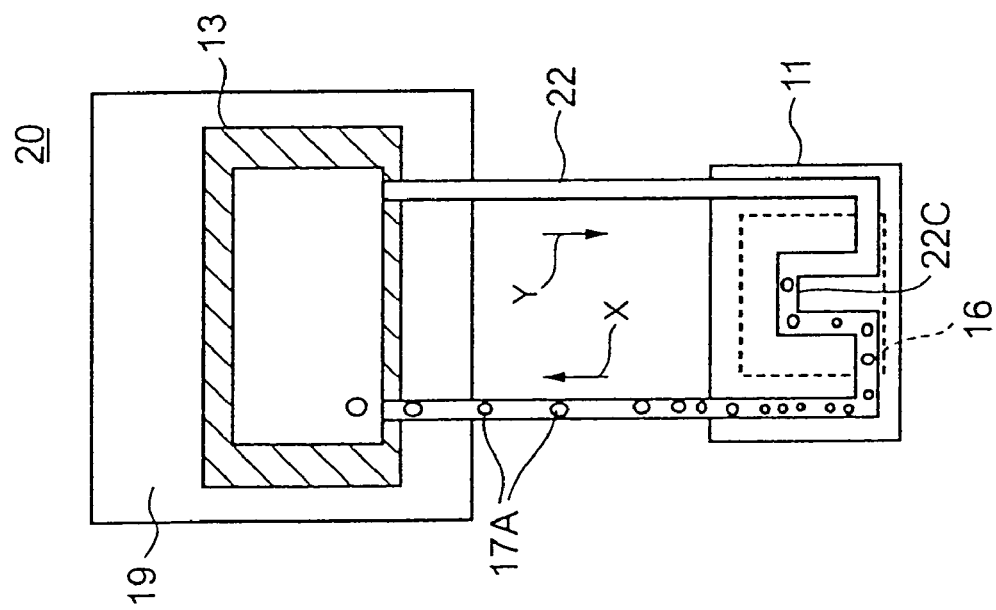

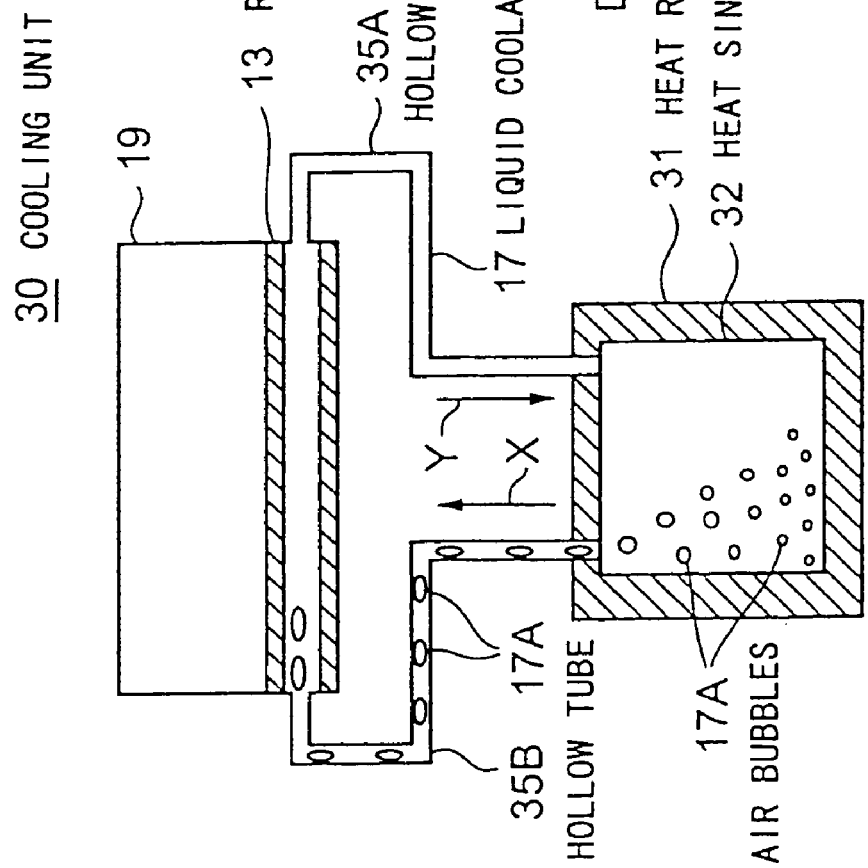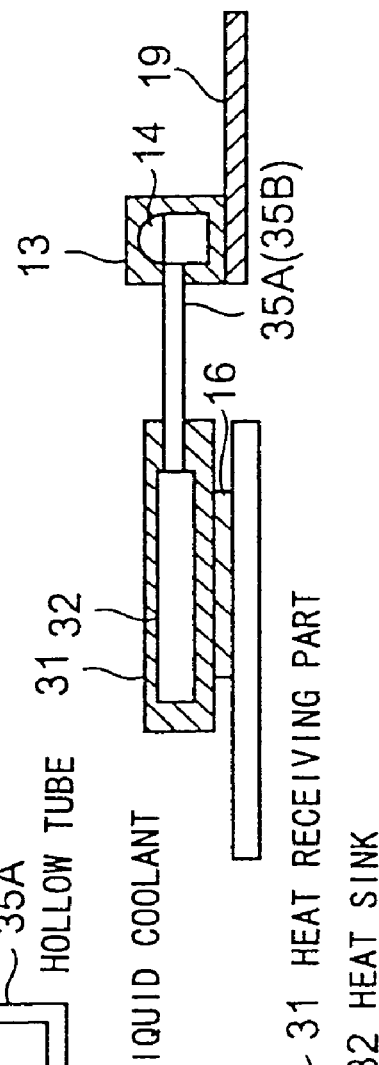

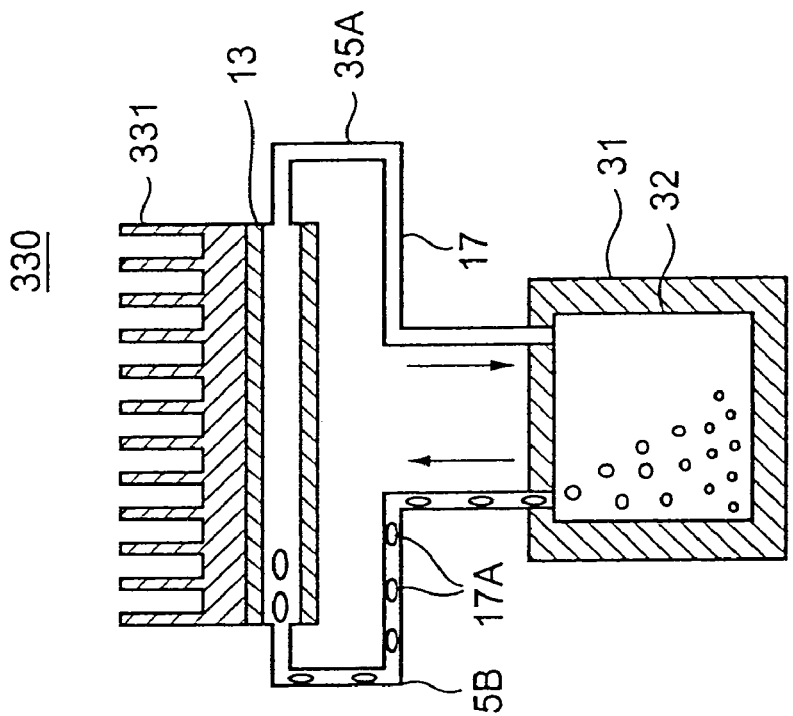
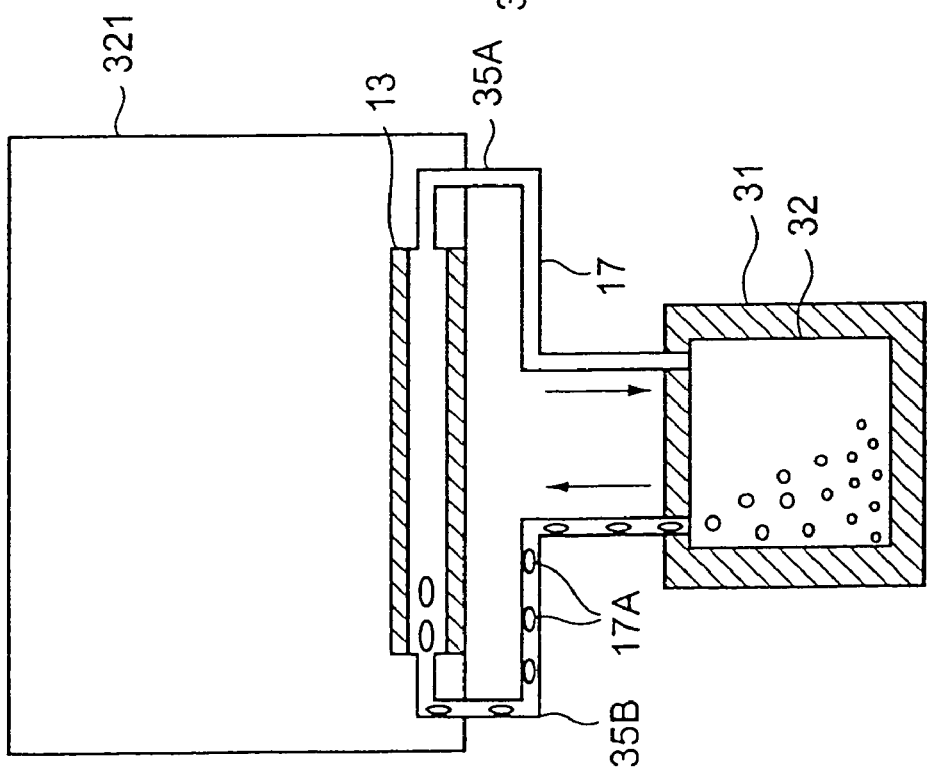

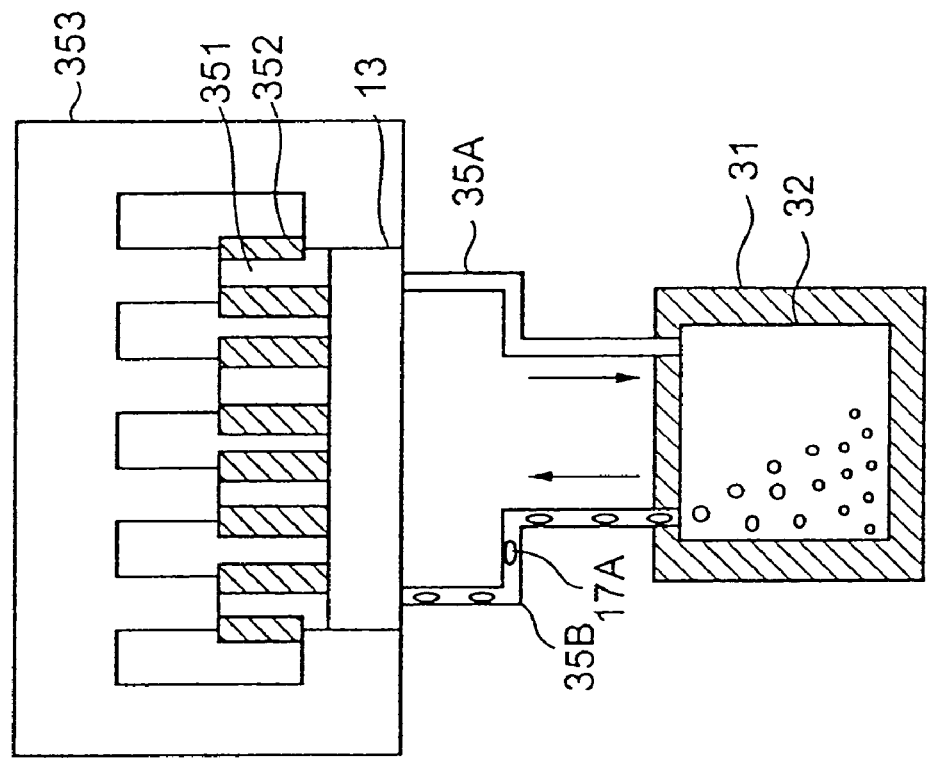
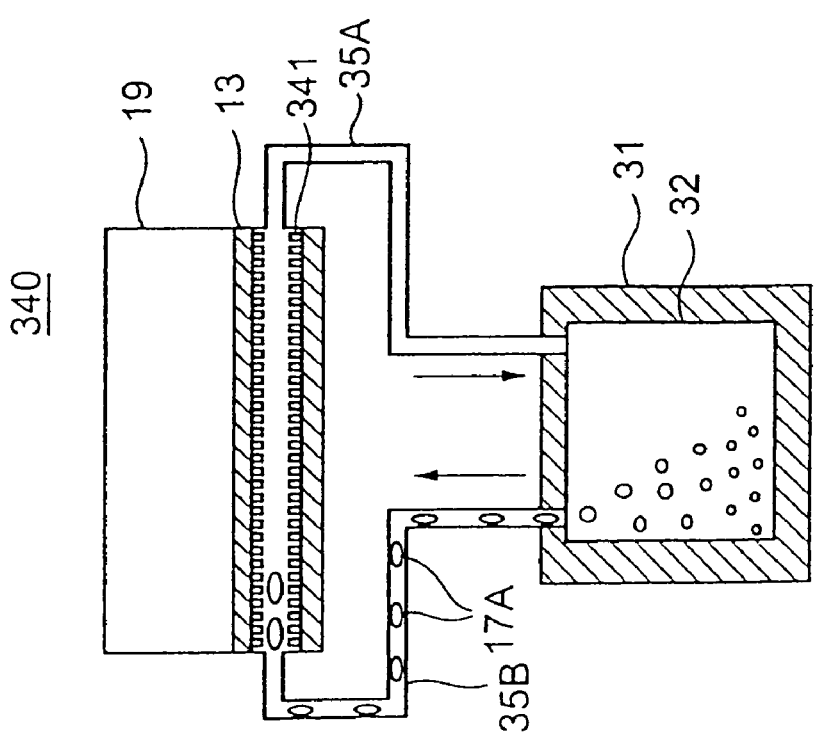

COOLING UNIT

This application is a divisional of application Ser. No. 10/407,464, filed Apr. 7, 2003, which is a divisional of application Ser. No. 09/548,426 filed Apr. 12, 2000, now U.S. Pat. No. 6,564,861, which is based upon and claims the benefit of priority from the prior Japanese Patent Application No. 11-250796, filed Sep. 3, 1999, the entire contents o which are incorporated herein by reference.

BACKGROUND OF THE INVENTION

1. Field of the Invention

The present invention relates generally to a cooling unit, and more particularly, to a cooling unit to be used with semiconductor elements and other such heat-generating components.

2. Description of the Related Art

Generally, electronic devices are provided with a large number of heat-generating components, first and foremost including the central processing unit, or CPU. As a result, in order to prevent the interior of the device from overheating a cooling unit is provided. In recent years a cooling unit for efficiently driving the CPU has come into particular demand.

Conventionally, the cooling units used in electronic devices are of two types: forced-air types and forced-liquid types. FIG. 1A is a diagram showing a conventional forced-air type cooling unit 100. FIG. 1B is a diagram showing a conventional forced-liquid type cooling unit 200.

As shown in FIG. 1A, the air-cooled cooling unit 100 has a heat sink 103 made from material having a high rate of heat transmission such as aluminum or copper is provided on a heated part 101. The heat sink 103 is provided with a multiplicity of fins in order to increase the radiative effect. In the cooling unit 100 a flow of air forcibly created by a fan 105 cools these fins and so cools the heated part 101.

Additionally, as shown in FIG. 1B, the liquid-cooled cooling unit 200 has thermally conductive cold plates 203 provided in direct contact with the heated part 201. These cold plates 203 are positioned so as to contact a pipe 204 through which a liquid coolant 209 circulates opposite the heated part 201. When the liquid coolant 209 passes through the heat exchanger 207 it is heat exchanged and cooled, so the cold plates 203 can also be cooled and, accordingly, the heated part 201 is also cooled. This liquid-cooled cooling unit 200 has a pump 205 and a heat exchanger 207 having a fan 208 to forcibly cool the heated part 201.

However, the above-described air-cooled cooling unit 100 uses air to cool the heated member 101, so the rate of heat transmission is very low and the radiative effect is poor. Moreover, the above-described cooling unit 100 uses an electrically driven fan 105 and thus requires power, in addition to which the fan generates noise and is subject to breakdowns.

The liquid-cooled cooling unit 200 described above, although it has good thermal conductivity, nevertheless still uses a pump 205 and a fan 208 and so is subject to the same disadvantages as those pertaining to the air-cooled cooling unit 100 described above, namely fan noise and fan breakdowns. Additionally, in the case of the liquid-cooled cooling unit 200 the pump or other equivalent circulatory device requires a great deal of space and must be maintained and serviced as well, which takes time and costs money.

SUMMARY OF THE INVENTION

Accordingly, it is a general object of the present invention to provide an improved and useful cooling unit in which the above-described disadvantages are eliminated.

Another and more specific object of the present invention is to provide and improved and useful cooling unit which does not use an external power source and hence is quiet, economical, efficient and capable of effectively cooling heated parts.

The above-described objects of the present invention are achieved by a cooling unit comprising:

a heat receiving unit that receives heat from a body radiating heat;

a radiator unit disposed at a distance from the heat receiving unit and radiating recovered heat;

a liquid coolant transporting heat generated at the heat receiving unit to the radiator; and a hollow tube disposed so that the liquid coolant circulates between the heat receiving unit and the radiator, a circulating flow of the liquid coolant formed by an elevating force of air bubbles generated from the heat received at the heat receiving unit, the radiator having an air pocket forming one part of the circulation path of the liquid coolant together with the hollow tube and capable of collecting the air bubbles.

According to the invention described above, the circulation path of the liquid coolant is formed by the motive force created by the elevating force of the air bubbles, so the liquid coolant can be circulated without the use of an external drive source, thus making it possible to transfer the heat of the heat-receiving part to the radiator via the liquid coolant at reduced cost and no noise.

Additionally, the heat of the heat-receiving part is absorbed as the heat of evaporation when the liquid coolant is turned into a gas and the heat of aggregation is released when the air bubbles that reach the radiator are condensed and returned to a liquid state, so heat can be transferred more efficiently from the heat receiving part to the radiator and a cooling unit of high cooling effectiveness and efficiency can be provided.

Other objects, features and advantages of the present invention will become more apparent from the following detailed description when read in conjunction with the accompanying drawings.

BRIEF DESCRIPTION OF THE DRAWINGS

FIGS. 2A and 2B are diagrams showing plan and side views, respectively, of a cooling unit according to a first embodiment of the present invention;

FIGS. 3A and 3B are diagrams showing plan and side views, respectively, of a cooling unit according to a second embodiment of the present invention;

FIGS. 4A and 4B are diagrams showing plan and side views, respectively, of a cooling unit according to a third embodiment of the present invention;

FIGS. 11A and 11B are diagrams showing plan views of two different cooling units 320 according to a tenth embodiment of the present invention; and FIGS. 12A and 12B are diagrams showing plan views of two different cooling units according to an eleventh embodiment of the present invention.

DESCRIPTION OF THE PREFERRED EMBODIMENTS

Figure 1A:
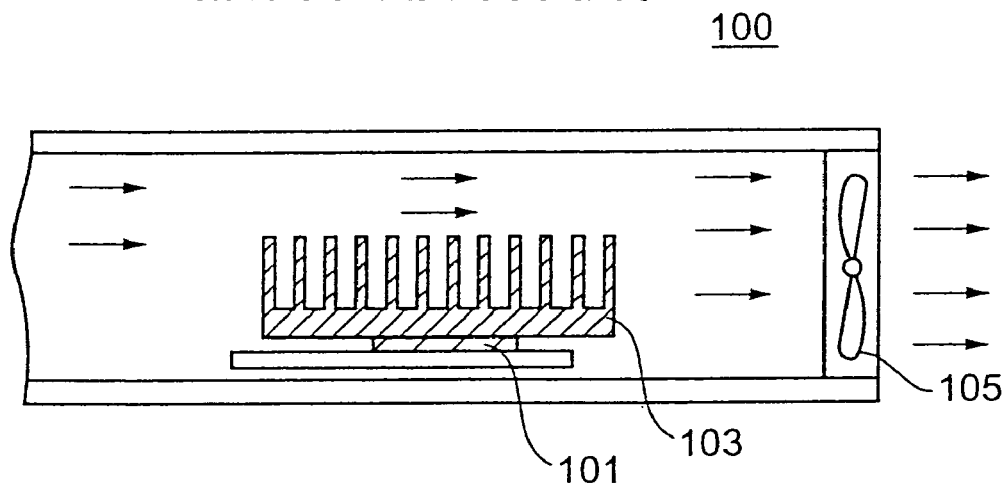
FIGS. 1A and 1B are diagrams showing a conventional forced-air type cooling unit 100 and a conventional forced-liquid type cooling unit 200, respectively.
Figure 1B:
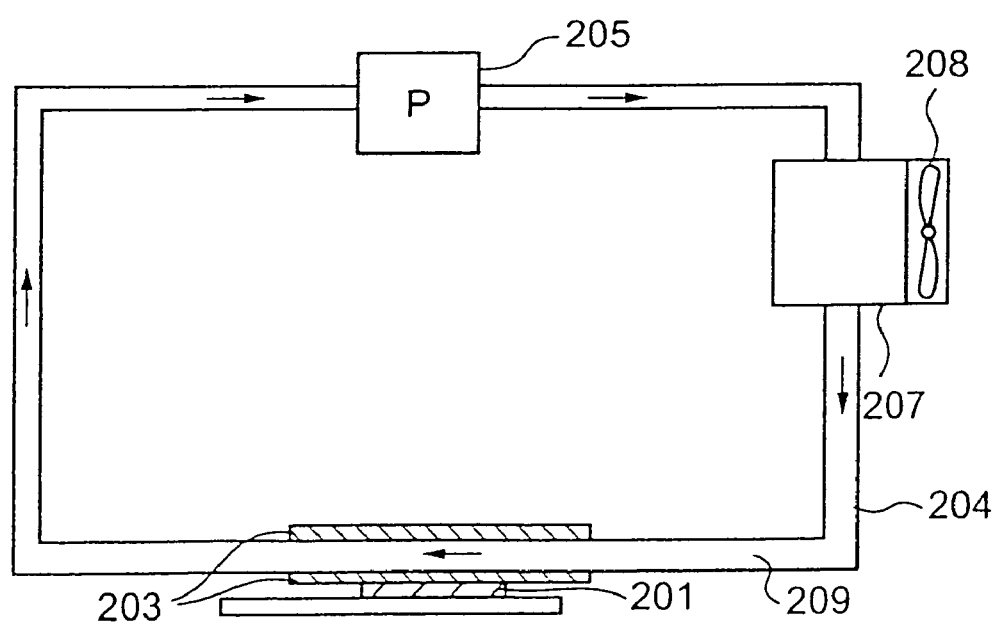

A description will now be given of embodiments of the present invention, with reference to the accompanying drawings. It should be noted that identical or corresponding elements are given identical or corresponding reference numbers in all drawings and detailed descriptions thereof are thus omitted.

FIGS. 2A and 2B are diagrams showing plan and side views, respectively, of a cooling unit 10 according to a first embodiment of the present invention.

As shown in the diagram, the cooling unit 10 comprises a heat-receiving part 11, a radiator 13 and a U-shaped central hollow tube 15.

The heat-receiving part 11 is positioned so as to contact a heat-emitting body 16 such as the CPU, and is made of a metal having high thermal conduction so as to take the heat from the heat-emitting body 16. The heat-receiving part 11 is further positioned in such a way that a curved portion of the U-shaped central hollow tube 15 for transporting a liquid coolant 17 to be described later is wrapped around the heat-emitting body 16.

The radiator 13 is positioned at a distance from the heat-receiving part 11 and is provided with a mechanism for radiating recovered heat. The radiator 13 includes an interior space that forms a part of the circulation path through with the liquid coolant 17 circulates, and further includes an air pocket 14 for recovering air bubbles when these are present in the liquid coolant 17. Additionally, a radiating member 19 having a large radiating surface area for rapidly dissipating recovered heat is fixedly mounted on the radiator 13.

In the cooling unit 10 described above, the hollow tube 15 is disposed in a U-shaped manner so that the above-described liquid coolant 17 can circulate between the heat-receiving part 11 and the radiator 13. It should be noted that both end portions 15A, 15B of the tube 15 are connected to the radiator 13, so that by filling the radiator 13 with liquid coolant 17 the liquid coolant 17 can circulate. The tube 15 itself can be made of teflon, polyurethane, nylon or some other flexible material which when formed into a hollow tube can still be used when bent. Additionally, it is preferable that the tube 15 have a circular or oval cross-section, and, further, that the tube 15 have an inner diameter of between 1 mm and 50 mm, preferably between 2 mm and 25 mm.

Although ordinary water can be used for the above-described liquid coolant 17, it is preferable that a liquid capable of boiling at a lower temperature be selected for the liquid coolant 17, such as, for example, fluorine, which has a boiling point of 56° C. and which is manufactured by 3M Corp. and marketed under the brand name Fluorinate.

As can be appreciated from the construction described above, the cooling unit 10 does not have a pump or other such external drive source for circulating the liquid coolant 17. A description will now be given of the mechanism by which the cooling unit 10 circulates the liquid coolant 17.

As might be expected, the heat-receiving part 11 receives heat from the heat-emitting member 16 and become hot. The curved portion 15C of the tube 15 that contacts the heat-receiving part 11 also becomes hot, with the liquid coolant 17 present inside the tube 15 boiling when a predetermined temperature is reached, producing bubbles of air 17A. The air bubbles 17A rise toward the radiator 13 via that part of the tube 15 posing the least resistance, the tube 15 extending laterally to the left and right of the curved portion 15C through the heat-emitting member 16 (on the left side in FIG. 2A). The rise of the air bubbles 17A produces an elevating force, on the basis of which an upward current X of the liquid coolant 17 arises. At the same time, a downward current Y of the liquid coolant 17 is created inside the tube 15 on the side away from the side on which the upward current X arises (on the right side in FIG. 2A).

Accordingly, within the circulation path of the liquid coolant 17 including the radiator 13, a circulating current of liquid coolant 17 is formed, the direction of which is determined by the driving force caused by the elevating force of the air bubbles 17A.

As described above, the present cooling unit 10 is thus able to circulate the liquid coolant 17 without using an external power source to do so. Accordingly, the heat arising at the heat-receiving part 11 from the heat-emitting member 16 is transported to the radiator 13 via the liquid coolant 17 where the heat is efficiently dissipated because the radiator 13 is provided with a radiating member 19.

Described in terms of the liquid coolant 17, air bubbles 17A are generated by absorbing the heat at the heat-receiving part 11, the liquid coolant 17 is driven upward by the elevating force of the rising air bubbles 17A, the liquid coolant 17 is then cooled at the radiator 13 and drops once more toward the heat-receiving part 11, where the process is repeated again from the beginning.

Additionally, when we consider the bubbles 17A in the liquid coolant 17, it can be appreciated that the air bubbles 17A do not only act as a motive force impelling the circulation of the liquid coolant 17 as described above. When the liquid coolant 17 changes from a liquid state to a gas, more heat is absorbed (latent heat absorption) from the heat-receiving part 11 as evaporative heat than is the case when the coolant is in a liquid state and transported to the radiator 13. The air bubbles 17A are gathered by the air pocket 14 of the radiator 13 but are here cooled and condense from a gaseous state back to a liquid state. At this time heat of aggregation is generated, in a development that is the converse of when the liquid coolant 17 is converted into a gas. Accordingly, the air bubbles 17A also perform the function of transporting the heat from the heat-receiving part 11 to the radiator 13 more efficiently.

As is clear from the foregoing, for the cooling unit 10 described above it is important to make certain that the air bubbles 17A are generated. For this purpose, it is sufficient to select the type of liquid coolant 17 to be used and the material and inner diameter of the hollow tube 15 after determining the temperature below which the heat-emitting member 16 should be maintained given the amount of heat generated by the heat-emitting member 16 and the operating temperature range of the apparatus.

Additionally, it is preferable that the air bubbles 17A be of a size that contacts the inner walls of the hollow tube 15 as the air bubbles 17A rise within the hollow tube 15, because such a size makes the circulation of the liquid coolant 17, which is thus alternately in a liquid state and a gaseous state, proceed more smoothly.

It should be noted that the present cooling unit 10 uses air bubbles 17A to circulate the liquid coolant 17, so in order to use the cooling unit 10 the radiator 13 must be positioned at a height higher than a height of the heat-receiving part 11. However, it is not necessary that the heat-receiving part 11 and the radiator 13 be positioned directly vertically one above the other but may instead be positioned at any angle at which the air bubbles 17A can securely rise upward. Additionally, there is no need to maintain the relative positions of the heat-receiving part 11 and the radiator 13 when the cooling unit 10 is not in use.

Accordingly, the cooling unit 10 described above is best suited for cooling such heat-generating elements as the CPU inside laptop or notebook-type personal computers, in which the display screen is flipped open in order to use the device.

Additionally, because the cooling unit 10 described above uses air bubbles 17A to form a circulating flow of liquid coolant 17 as noted previously, there is no need for an external drive source and hence the cooling unit is economical and quiet. Additionally, because the cooling unit 17 described above also utilizes the heat of evaporation, the transfer of heat from the heat-receiving part 11 to the radiator 13 can be carried out efficiently. Accordingly, the heat-emitting member 16 can be cooled efficiently.

A description will now be given of a cooling unit according to a second embodiment of the present invention, with reference to the accompanying drawings.

FIGS. 3A and 3B are diagrams showing plan and side views, respectively, of a cooling unit 20 according to a second embodiment of the present invention. As shown in the diagrams, the cooling unit 20 according to the second embodiment of the present invention has essentially the same structure as the cooling unit 10 according to the first embodiment of the present invention described above.

The cooling unit 20 according to the second embodiment comprises a heat-receiving part 11, a radiator 13 and a hollow tube 22. The hollow tube 22 has a bent portion 22C inside the heat-receiving part 11, with the hollow tube 22 having an enlarged contact surface area contacting an inner surface of the heat-receiving part 11. Accordingly, the heat absorbed by the liquid coolant 17 that circulates inside the hollow tube 22 increases, so the cooling effect can be increased.

A description will now be given of a cooling unit according to a third embodiment of the present invention, with reference to the accompanying drawings.

FIGS. 4A and 4B are diagrams showing plan and side views, respectively, of a cooling unit 30 according to a third embodiment of the present invention. As with the cooling unit 20 according to the second embodiment of the present invention, the cooling unit 30 according to a third embodiment of the present invention has essentially the same structure as the cooling unit 10 according to the first embodiment of the present invention described above.

As shown in the diagram, in the cooling unit 30 according to the third embodiment of the present invention a heat-receiving part 31 includes a heat sink 32 capable of containing a specified volume of liquid coolant 17. A heat-emitting member 16 contacts a back portion of the heat sink 32.

The capacity of the heat sink 32 to contain liquid coolant 17 is enlarged so that more of the heat generated by the heat-emitting member 16 is transferred more quickly by the liquid coolant 17. The heat sink 32 is formed from a thermally conductive material in the shape of a box inside the heat-receiving part 31. Accordingly, the liquid coolant 17 and the member that forms the heat-receiving part 31 directly contact each other without the intervention of a hollow tube, so the thermal resistance decreases and the amount of heat absorbed by the liquid coolant 17 increases.

As shown in the diagram, the heat sink 32 of the cooling unit 30 is connected to the radiator 13 via two hollow tubes 35A, 35B. When the liquid coolant 17 circulates, the heat sink 32 also forms one part of the circulation path of the liquid coolant 17 together with the radiator 13 and the hollow tubes 35A, 35B.

In the cooling unit 30 according to the third embodiment as well, the liquid coolant 17 inside the heat sink 32 absorb heats, becomes hot, boils and thus generates air bubbles 17A which rise toward the radiator 13 via whichever of the hollow tubes 35A, 35B offers the least internal resistance (in the embodiment shown in FIG. 4A, the left side, that is, hollow tube 35B). As a result, an upwardly rising current X of liquid coolant 17 is generated using an elevating force of the air bubbles 17A as a source of motive power. At the same time, a downwardly falling current Y of liquid coolant 17 is generated inside the other hollow tube 35A through which the air bubbles 17A do not rise, thus completing the circulation path of the liquid coolant 17.

The cooling unit 30 according to the third embodiment also uses air bubbles 17A to form a circulating flow of liquid coolant 17 as noted previously, so there is no need for an external drive source and hence the cooling unit is economical and quiet. Additionally, because the cooling unit 17 described above also utilizes the heat of evaporation, the transfer of heat from the heat-receiving part 11 to the radiator 13 can be carried out efficiently. Accordingly, the heat-emitting member 16 can be cooled efficiently.

A description will now be given of a cooling unit according to a fourth embodiment of the present invention, with reference to the accompanying drawings.

Figure 5:
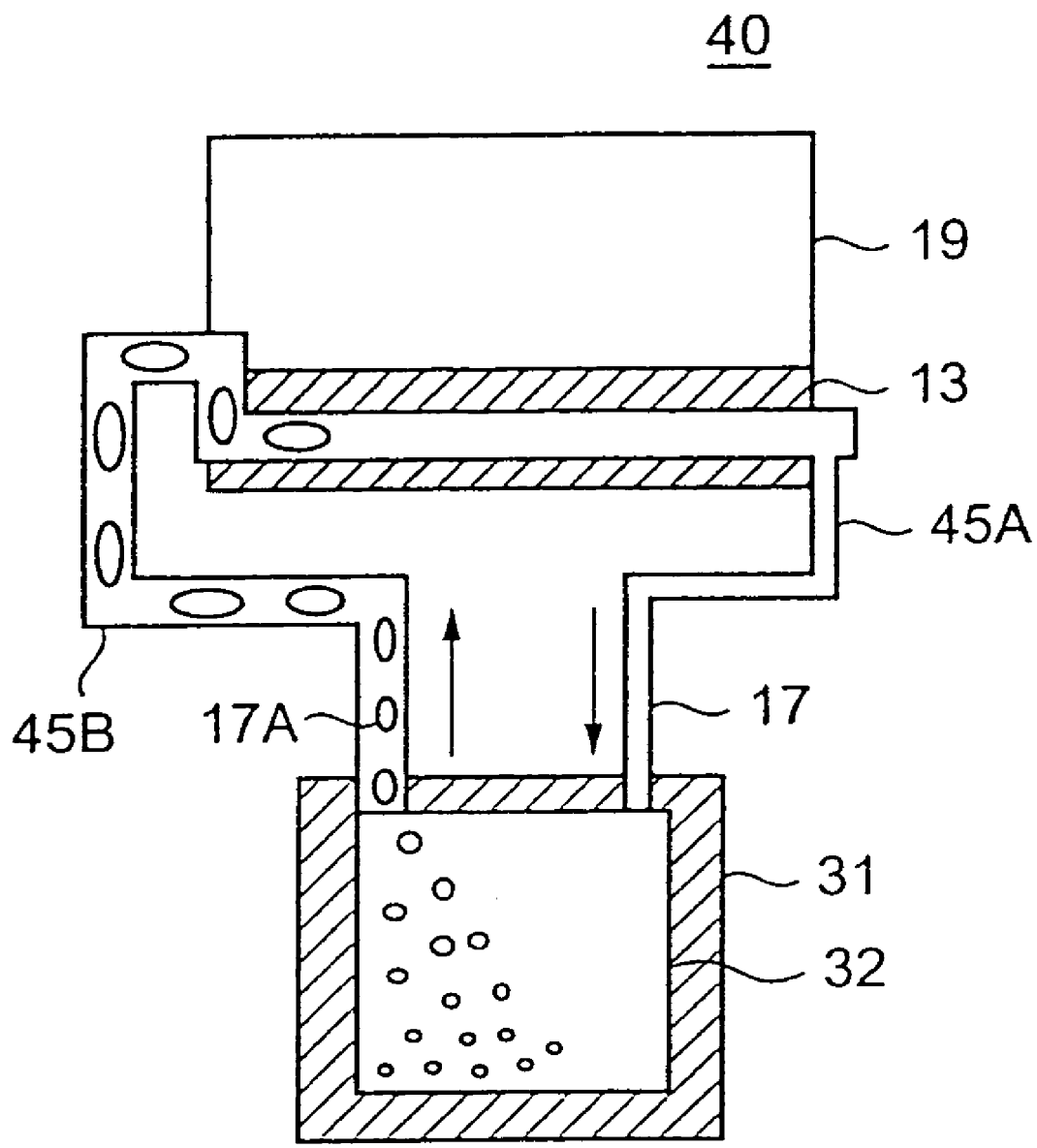
FIG. 5 is a diagram showing a plan view of a cooling unit according to a fourth embodiment of the present invention.

FIG. 5 is a diagram showing a plan view of a cooling unit according to a fourth embodiment of the present invention. As shown in the diagram, the cooling unit 40 according to the fourth embodiment of the present invention has essentially the same structure as the cooling unit 10 according to the first embodiment of the present invention described above.

As shown in the diagram, two hollow tubes 45A, 45B connect a heat sink 32 to a radiator 13. A diameter of the hollow tube 45B is larger than a diameter of the hollow tube 45A. By thus providing for one of the hollow tubes to be fatter than the other, air bubbles 17A generated from the liquid coolant 17 flow to the side of lesser internal resistance 45B, thus starting the circulation of the liquid coolant 17. Accordingly, it is thus possible to control the direction of circulation of the liquid coolant 17. Additionally, when the two hollow tubes have the same diameter it sometimes takes time for the direction of circulation of the liquid coolant 17 to be determined. When, however, the direction of circulation of the liquid coolant 17 is previously determined as with the cooling unit 40 described above, the time it takes for the circulatory flow of the liquid coolant 17 to be formed is shortened and the cooling unit 40 can begin to function quickly.

A description will now be given of a cooling unit according to a fifth embodiment of the present invention, with reference to the accompanying drawings.

Figure 6:
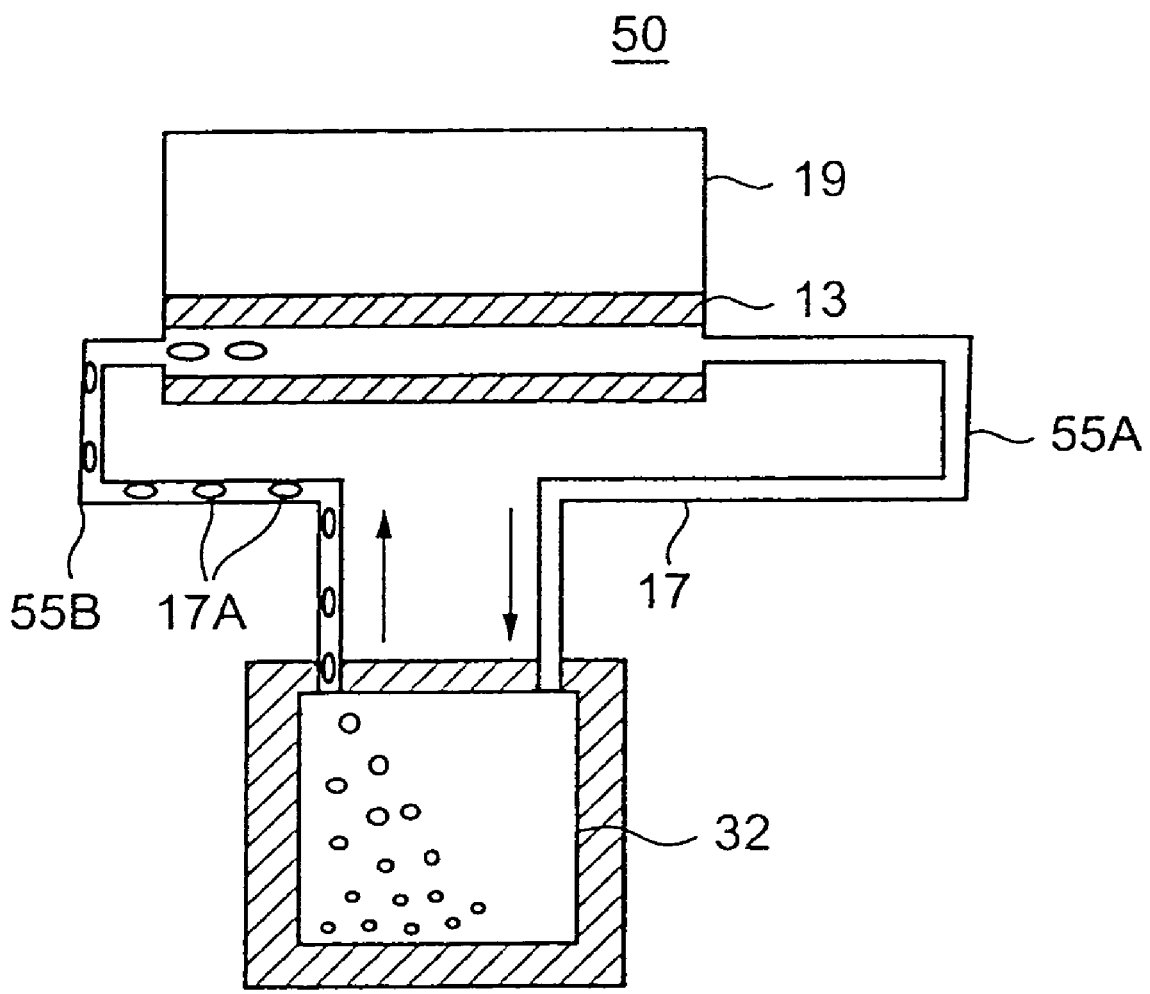
FIG. 6 is a diagram showing a plan view of a cooling unit according to a fifth embodiment of the present invention.

FIG. 6 is a diagram of a plan view of a cooling unit according to a fifth embodiment of the present invention. The cooling unit 50 according to the fifth embodiment of the present invention has essentially the same structure as the cooling unit 30 according to the third embodiment of the present invention described above, being a variation of same insofar as the two hollow tubes are of different lengths.

A heat sink 32 of the cooling unit 50 is connected to a radiator 13 by two hollow tubes 55A, 55B, with hollow tube 55B having a length shorter than that of hollow tube 55A. By thus making one of the hollow tubes shorter than the other, air bubbles 17A generated from the liquid coolant 17 flow to the side of lesser internal resistance 55B, thus starting the circulation of the liquid coolant 17. Accordingly, it is thus possible to control the direction of circulation of the liquid coolant 17. Additionally, when the two hollow tubes have the same length it sometimes takes time for the direction of circulation of the liquid coolant 17 to be determined. When, however, the direction of circulation of the liquid coolant 17 is previously determined as with the cooling unit 50 described above, the time it takes for the circulatory flow of the liquid coolant 17 to be formed is shortened and the cooling unit 50 can begin to function quickly.

A description will now be given of a cooling unit according to a sixth embodiment of the present invention, with reference to the accompanying drawings.

Figures 7A, 7B:
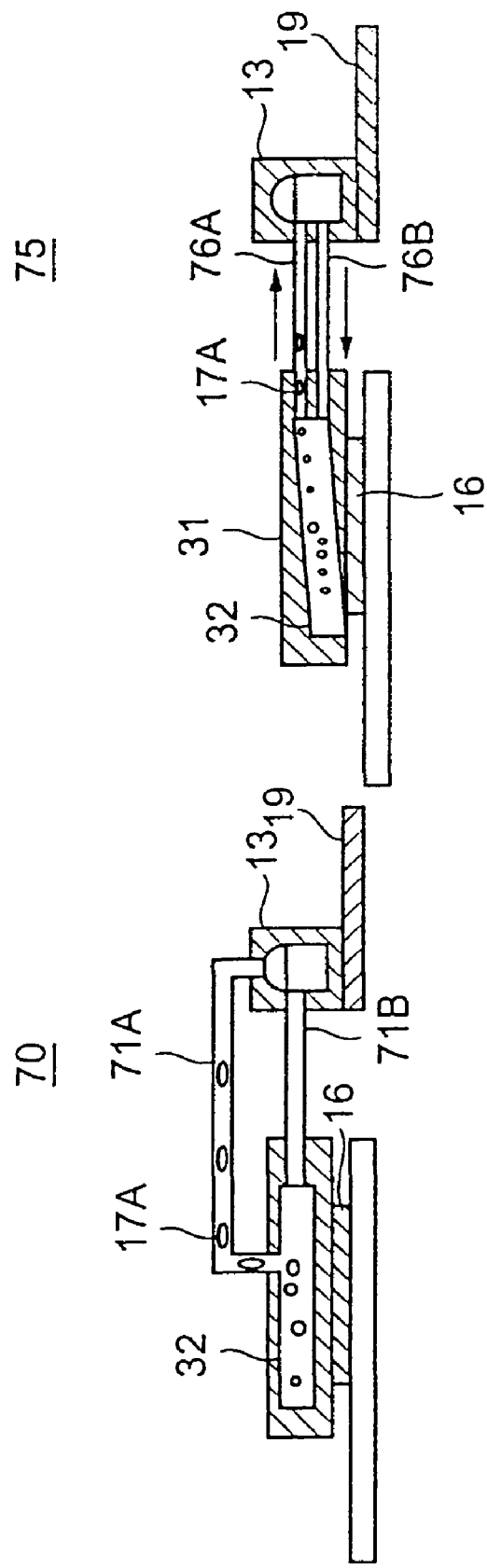
FIGS. 7A and 7B are diagrams showing a side view of one cooling unit 70 according to a sixth embodiment of the present invention and a side view of another cooling unit 75 according to a sixth embodiment of the present invention, respectively.

FIG. 7A is a diagram showing a side view of a cooling unit 70 according to a sixth embodiment of the present invention and FIG. 7B is a diagram showing a side view of another cooling unit 75 according to a sixth embodiment of the present invention.

The cooling units 70 and 75 according to a sixth embodiment of the present invention have essentially the same structure as the cooling unit 30 according to a third embodiment of the present invention described above, being two variations of same insofar as the heights of the two hollow tubes 15 differ at time of usage.

According to the cooling unit 70 shown in FIG. 7A, a heat sink 32 is connected to a radiator 13 by two hollow tubes 71A, 71B. Hollow tube 71A is extended from a side surface of the heat sink 32 so as to be positioned at a height higher than that of hollow tube 71B and is connected to the radiator 13 after rising upward. By thus positioning hollow tube 71A higher than hollow tube 71B, air bubbles 17A generated from the liquid coolant 17 flow to the side of lesser internal resistance 55B, thus starting the circulation of the liquid coolant 17. Accordingly, it is thus possible to control the direction of circulation of the liquid coolant 17. Additionally, the time it takes for the circulatory flow of the liquid coolant 17 to be formed is shortened and the cooling unit 70 can begin to function quickly.

The cooling unit 75 shown in FIG. 7B resembles the cooling unit 70 shown in FIG. 7A above. A hollow tube 76A is positioned at a height higher than that of hollow tube 76B and substantially parallel to hollow tube 76B, the two hollow tubes 76A, 76B being connected between the heat sink 32 and the radiator 13. Additionally, the heat sink 32 is disposed at a slant within the heat-receiving part 31, so that air bubbles 17A may easily enter hollow tube 76A. With the cooling unit 75 having a structure such as that described above, the same effect can be obtained as with the cooling unit 70 described above.

A description will now be given of a cooling unit according to a seventh embodiment of the present invention, with reference to the accompanying drawings.

Figure 8A:
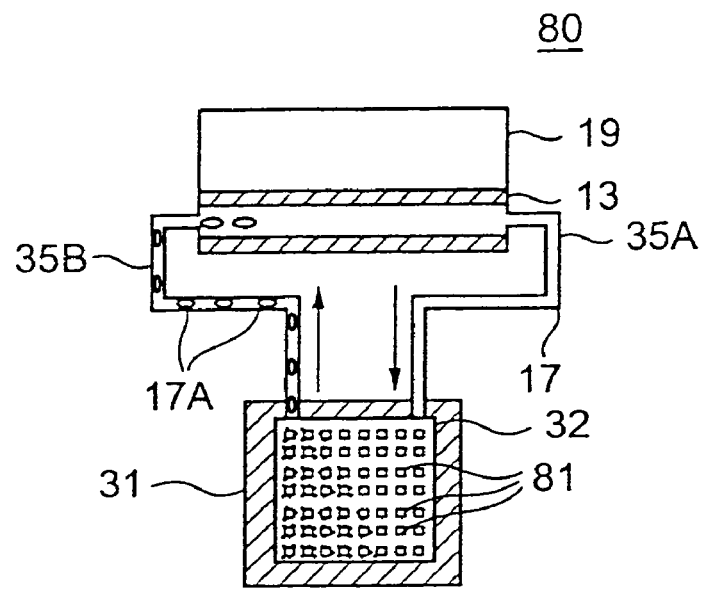
FIGS. 8A, 8B and 8C diagrams showing plan views of cooling units 80, 83 and 86, respectively, according to a seventh embodiment of the present invention.
Figures 8B, 8C:
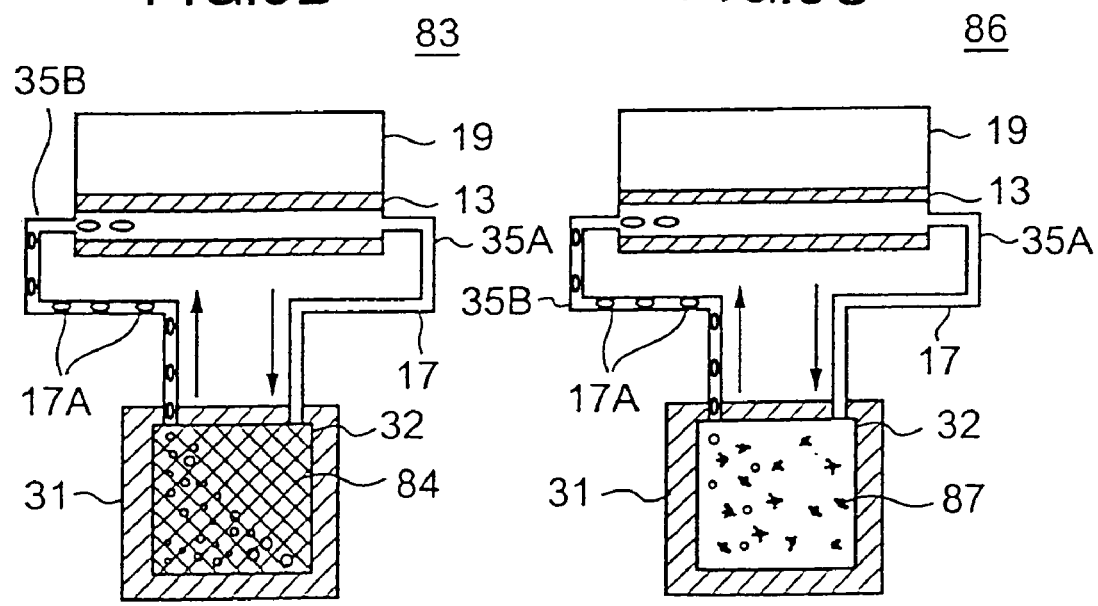

FIGS. 8A, 8B and 8C are diagrams showing plan views of cooling units 80, 83 and 86, respectively, according to a seventh embodiment of the present invention.

The cooling units 80, 83 and 86 according to a seventh embodiment of the present invention have essentially the same structure as the cooling unit 30 according to a third embodiment of the present invention described above, being embodiments in which an air bubble generation promoting member promoting air bubble generation is provided in the heat sink.

In the cooling unit 80 shown in FIG. 8A, a multiplicity of horn-shaped pins 81 are provided inside the heat sink 32 as air bubble generation promoting members. By providing these multiple air bubble generation promoting members the generation of air bubbles can be promoted, and accordingly, the capacity of the heat sink to receive heat can be improved.

Similarly, in the cooling unit 83 shown in FIG. 8B a net-like member 84 is provided inside the heat sink 32 as an air bubble generation promoting member. Additionally, in the cooling unit 86 shown in FIG. 8C, a multiplicity of small particles 87 are scattered about within the heat sink as air bubble generation promoting members.

In the case of the cooling units 83 and 86 shown in FIGS. 8B and 8C as well, the generation of air bubbles can be promoted, and accordingly, the capacity of the heat sink to receive heat can be improved.

Additionally, it should be noted that a member having a roughed surface may be provided on an interior wall of the heat sink 32 as an air bubble generation promoting member.

A description will now be given of a cooling unit according to an eighth embodiment of the present invention, with reference to the accompanying drawings.

Figure 9A:
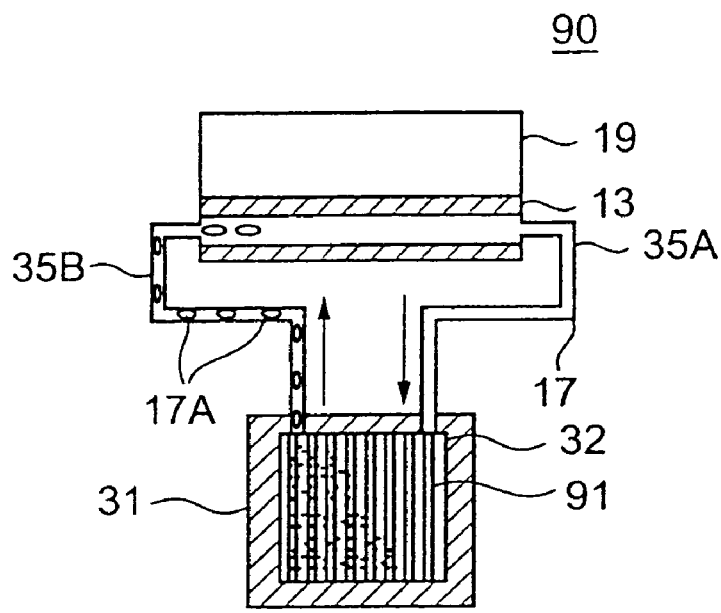
FIGS. 9A, 9B and 9C are diagrams showing plan views of cooling units 90, 93 and 96, respectively, according to an eighth embodiment of the present invention.
Figures 9B, 9C:
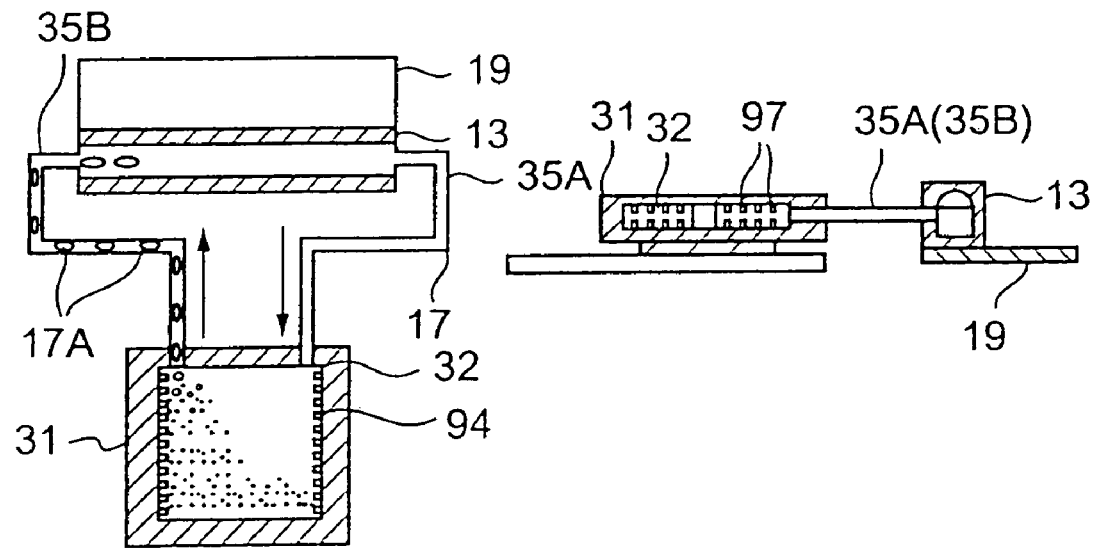

FIGS. 9A, 9B and 9C are diagrams showing plan views of cooling units 90, 93 and 96, respectively, according to an eighth embodiment of the present invention.

In the cooling unit 90 shown in FIG. 9A, a multiplicity of parallel fins 91 made of a heat transmitting material is provided in the heat sink as heat transmission promoting members promoting transmission of heat to a liquid coolant 17. By so doing, the contact surface area between the heat sink 32 and the liquid coolant 17 is increased, thus increasing the capacity of the heat sink 32 to receive heat and, accordingly, increasing the cooling of the heat-emitting member 16.

Similarly, the cooling unit 93 shown in FIG. 9B has a number of grooves 94 formed on the interior wall of the heat sink 32 as heat transmission promoting members promoting transmission of heat to a liquid coolant 17. Additionally, in the cooling unit 96 shown in FIG. 9C a multiplicity of fins 97 is provided on upper and lower inner surfaces of the heat sink 32 as heat transmission promoting members promoting transmission of heat to the liquid coolant 17.

In the case of the cooling units 93 and 96 shown in FIGS. 9B and 9C as well, the surface area of contact between the liquid coolant 17 and the heat sink 32 can be improved, the capacity of the heat sink to receive heat can be improved.

A description will now be given of a cooling unit according to a ninth embodiment of the present invention, with reference to the accompanying drawings.

Figure 10A:
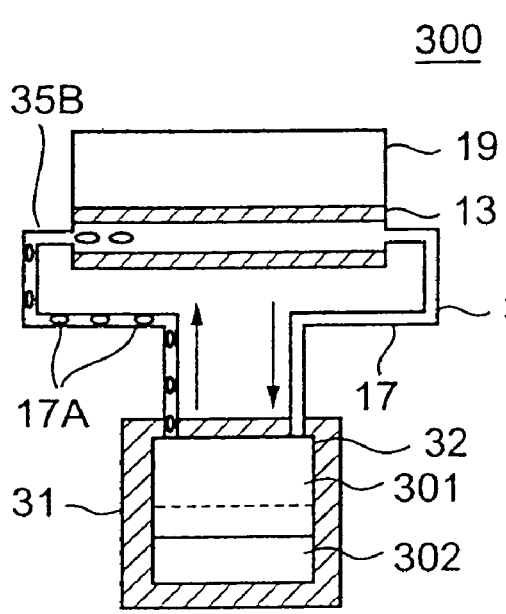
FIGS. 10A, 10B and 10C are diagrams showing plan and side views of one cooling unit and a plan view of another cooling unit, respectively, according to a ninth embodiment of the present invention.
Figure 10B:
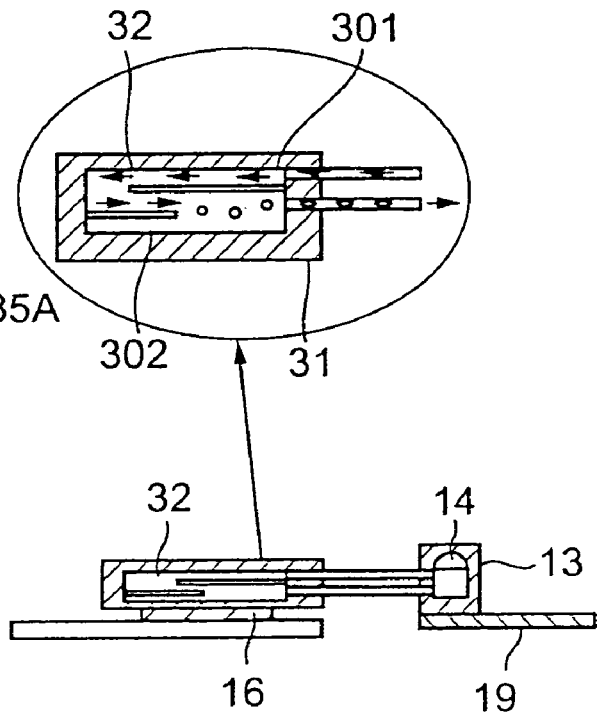
Figure 10C:
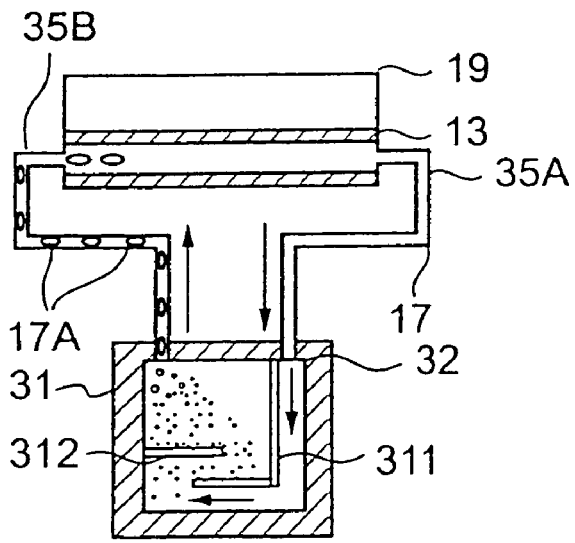

FIGS. 10A, 10B and 10C are diagrams showing plan and side views of one cooling unit 300 and a plan view of another cooling unit 310, respectively, according to a ninth embodiment of the present invention.

The cooling units 300 and 310 according to the ninth embodiment of the present invention have essentially the same structure as the cooling unit 30 according to the third embodiment of the present invention described above, having a flow path for the purpose of efficiently transmitting heat to a liquid coolant 17 within a heat sink 32, so that the liquid coolant 17 flowing from a radiator 13 fully absorbs heat before being returned to the radiator 13.

Specifically, the cooling unit 300 shown in FIGS. 10A and 10B is provided with dividing panels 301 and 302 inside the heat sink 32. These dividing panels 301, 302 provided inside the heat sink 32 are disposed so that the liquid coolant 17 that has been cooled by and is returning from the radiator 13 rises once more toward the radiator 13 only after fully absorbing heat. The dividing panels 301, 302 are disposed alternately so that the cooled heavy liquid coolant 17 returning from the radiator 13 falls through the inside of the heat sink in stages.

By providing a flow path within the heat sink 32 as described above, heat can be efficiently transferred from the heat sink 32 to the radiator 13 without disrupting the flow of the liquid coolant 17.

Similarly, the cooling unit 310 shown in FIG. 10C also has dividing panels 311, 312 disposed inside the heat sink 32 so as to form a flow path, with the cooled heavy liquid coolant 17 returning from the radiator 13 falling through the interior of the heat sink 32 after which the liquid coolant 17 absorbs heat and once again rises toward the radiator 13.

By providing a flow path within the heat sink 32 as described above, the cooling unit 310 can efficiently transfer heat from the heat sink 32 to the radiator 13 without disrupting the flow of the liquid coolant 17.

A description will now be given of a cooling unit according to a tenth embodiment of the present invention, with reference to the accompanying drawings.

FIGS. 11A and 11B are diagrams showing plan views of cooling units 320 and 330, respectively, according to a tenth embodiment of the present invention.

The cooling units 320 and 330 according to the tenth embodiment of the present invention have essentially the same structure as the cooling unit 30 according to the third embodiment of the present invention described above, a member for improving heat radiation being provided on a radiator 13.

In the cooling unit 320 shown in FIG. 11A, the radiator 13 is equipped with a radiative plate 321 having an enlarged surface area, by means of which the radiative effect at the radiator 13 can be increased.

Similarly, the cooling unit 330 shown in FIG. 11B is also equipped with a radiative fin 331 on the radiator 13. With this type of radiating member, too, the radiative effect at the radiator 13 can be increased.

A description will now be given of a cooling unit according to an eleventh embodiment of the present invention, with reference to the accompanying drawings.

FIGS. 12A and 12B are diagrams showing plan views of cooling units 340 and 350, respectively, according to an eleventh embodiment of the present invention.

The cooling units 340 and 350 according to the tenth embodiment of the present invention have essentially the same structure as the cooling unit 30 according to the third embodiment of the present invention described above, a heat removing means for efficiently removing heat from a liquid coolant 17 being provided inside a radiator 13.

In the cooling unit 340 according to an eleventh embodiment of the present invention as shown in FIG. 12A, a multiplicity of heat-receiving fins 341 as heat removing means is provided on an interior surface of the radiator 13. Accordingly, a surface area of contact between the radiator 13 and the hot liquid coolant 17 is thus increased so it is possible to remove heat from the liquid coolant 17 efficiently, and accordingly, the cooling effectiveness of the cooling unit as a whole can be improved.

Similarly, in the cooling unit 350 according to an eleventh embodiment of the present invention as shown in FIG. 12B, a multiplicity of dividing panels 352 made of thermally conductive material are provided as heat removing means at a region in the interior of the radiator 13 that contacts the liquid coolant 17, thereby forming a heat-removing flow path 351 between the dividing panels 352.

By forming the dividing panels 352 and the heat-removing flow path 351 therebetween as described above, air bubbles 17A in the liquid coolant 17 are burst upon entering the heat-removing flow path 351 and thereby radiate large amounts of heat, so it is fully possible to remove heat from the liquid coolant 17.

It should be noted that, in the present embodiment, the radiating member 353, together with the dividing panels 352 and the heat-removing flow path 351, are given the shape of the teeth of a comb so as to better radiate and remove heat, thus improving the cooling effectiveness of the cooling unit as a whole.

The above description is provided in order to enable any person skilled in the art to make and use the invention and sets forth the best mode contemplated by the inventors of carrying out the invention.

The present invention is not limited to the specifically disclosed embodiments, and variations and modifications may be made without departing from the spirit and scope of the present invention.

The present application is based on Japanese Priority Application No. 11-250796, filed on Sep. 3, 1999, the entire contents of which are hereby incorporated by reference.

The invention claimed is:

1. A cooling unit comprising:
   a heat receiving unit that receives heat from a body radiating heat;
   a radiator unit disposed at a distance from the heat receiving unit and radiating recovered heat;
   a liquid coolant transporting heat generated at the heat receiving unit to the radiator; and
   two distinct hollow tubes disposed so that the liquid coolant circulates between the heat receiving unit and the radiator, each of the hollow tubes forming a separate fluid path between the heat receiving unit and the radiator, the liquid coolant in one tube flowing from the heat receiving unit to the radiator, and the liquid coolant in the other tube flowing from the radiator to the heat receiving unit,
   a circulating flow of the liquid coolant formed by an elevating force of air bubbles generated from the heat received at the heat receiving unit, the radiator having an air pocket forming one part of the circulation path of the liquid coolant together with the hollow tubes and capable of collecting the air bubbles,
   wherein the heat receiving unit includes a heat sink forming one part of the circulation path of the liquid coolant together with the hollow tubes and the radiator and having a cross-sectional area larger than a cross-sectional area of each hollow tube so as to be capable of collecting a predetermined amount of the liquid coolant so that a portion of the collected liquid coolant turns into air bubbles and flows into one of the hollow tubes and causes liquid coolant to flow with the air bubbles,
   wherein said circulating flow of liquid coolant may flow in either of two directions, said flow direction being determined by which direction offers the least internal resistance, and wherein said two hollow tubes connecting the heat sink and the radiator are connected at positions of the same height so that the coolant can flow in either of the two directions,
   wherein the two hollow tubes connect the heat sink and the radiator, one of the hollow tubes having a diameter larger than a diameter of the other hollow tube.

2. A cooling unit comprising:
   a heat receiving unit that receives heat from a body radiating heat;
   a radiator unit disposed at a distance from the heat receiving unit and radiating recovered heat;

a liquid coolant transporting heat generated at the heat receiving unit to the radiator; and two distinct hollow tubes disposed so that the liquid coolant circulates between the heat receiving unit and the radiator, each of the hollow tubes forming a separate fluid path between the heat receiving unit and the radiator, the liquid coolant in one tube flowing from the heat receiving unit to the radiator, and the liquid coolant in the other tube flowing from the radiator to the heat receiving unit, a circulating flow of the liquid coolant formed by an elevating force of air bubbles generated from the heat received at the heat receiving unit, the radiator having an air pocket forming one part of the circulation path of the liquid coolant together with the hollow tubes and capable of collecting the air bubbles, wherein the heat receiving unit includes a heat sink forming one part of the circulation path of the liquid coolant together with the hollow tubes and the radiator and having a cross-sectional area larger than a cross-sectional area of each hollow tube so as to be capable of collecting a predetermined amount of the liquid coolant so that a portion of the collected liquid coolant turns into air bubbles and flows into one of the hollow tubes and causes liquid coolant to flow with the air bubbles, wherein said circulating flow of liquid coolant may flow in either of two directions, said flow direction being determined by which direction offers the least internal resistance, and wherein said two hollow tubes connecting the heat sink and the radiator are connected at positions of the same height so that the coolant can flow in either of the two directions, wherein the two hollow tubes connect the heat sink and the radiator, one of the hollow tubes having a length shorter than a length of the other hollow tube.

3. A cooling unit comprising:

a heat receiving unit that receives heat from a body radiating heat;

a radiator unit disposed at a distance from the heat receiving unit and radiating recovered heat;

a liquid coolant transporting heat generated at the heat receiving unit to the radiator; and two distinct hollow tubes disposed so that the liquid coolant circulates between the heat receiving unit and the radiator, each of the hollow tubes forming a separate fluid path between the heat receiving unit and the radiator, the liquid coolant in one tube flowing from the heat receiving unit to the radiator, and the liquid coolant in the other tube flowing from the radiator to the heat receiving unit, a circulating flow of the liquid coolant formed by an elevating force of air bubbles generated from the heat received at the heat receiving unit, the radiator having an air pocket forming one part of the circulation path of the liquid coolant together with the hollow tubes and capable of collecting the air bubbles, wherein the heat receiving unit includes a heat sink forming one part of the circulation path of the liquid coolant together with the hollow tubes and the radiator and having a cross-sectional area larger than a cross-sectional area of each hollow tube so as to be capable of collecting a predetermined amount of the liquid coolant so that a portion of the collected liquid coolant turns into air bubbles and flows into one of the hollow tubes and causes liquid coolant to flow with the air bubbles, wherein said circulating flow of liquid coolant may flow in either of two directions, said flow direction being determined by which direction offers the least internal resistance, wherein the two hollow tubes connect the heat sink and the radiator, one of the hollow tubes disposed at a height higher than a height of the other hollow tube.

4. A cooling unit comprising:

a heat receiving unit that receives heat from a body radiating heat;

a radiator unit disposed at a distance from the heat receiving unit and radiating recovered heat;

a liquid coolant transporting heat generated at the heat receiving unit to the radiator; and two distinct hollow tubes disposed so that the liquid coolant circulates between the heat receiving unit and the radiator, each of the hollow tubes forming a separate fluid path between the heat receiving unit and the radiator, the liquid coolant in one tube flowing from the heat receiving unit to the radiator, and the liquid coolant in the other tube flowing from the radiator to the heat receiving unit, a circulating flow of the liquid coolant formed by an elevating force of air bubbles generated from the heat received at the heat receiving unit, the radiator having an air pocket forming one part of the circulation path of the liquid coolant together with the hollow tubes and capable of collecting the air bubbles, wherein the heat receiving unit includes a heat sink forming one part of the circulation path of the liquid coolant together with the hollow tubes and the radiator and having a cross-sectional area larger than a cross-sectional area of each hollow tube so as to be capable of collecting a predetermined amount of the liquid coolant so that a portion of the collected liquid coolant turns into air bubbles and flows into one of the hollow tubes and causes liquid coolant to flow with the air bubbles, wherein said circulating flow of liquid coolant may flow in either of two directions, said flow direction being determined by which direction offers the least internal resistance, and wherein said two hollow tubes connecting the heat sink and the radiator are connected at positions of the same height so that the coolant can flow in either of the two directions, wherein an air bubble generation promoting member promoting air bubble generation is provided in the heat sink.

5. A cooling unit comprising:

a heat receiving unit that receives heat from a body radiating heat;

a radiator unit disposed at a distance from the heat receiving unit and radiating recovered heat;

a liquid coolant transporting heat generated at the heat receiving unit to the radiator; and two distinct hollow tubes disposed so that the liquid coolant circulates between the heat receiving unit and the radiator, each of the hollow tubes forming a separate fluid path between the heat receiving unit and the radiator, the liquid coolant in one tube flowing from the heat receiving unit to the radiator, and the liquid coolant in the other tube flowing from the radiator to the heat receiving unit, a circulating flow of the liquid coolant formed by an elevating force of air bubbles generated from the heat received at the heat receiving unit, the radiator having an air pocket forming one part of the circulation path of the liquid coolant together with the hollow tubes and capable of collecting the air bubbles, wherein the heat receiving unit includes a heat sink forming one part of the circulation path of the liquid coolant together with the hollow tubes and the radiator and having a cross-sectional area larger than a cross-sectional area of each hollow tube so as to be capable of collecting a predetermined amount of the liquid coolant so that a portion of the collected liquid coolant turns into air bubbles and flows into one of the hollow tubes and causes liquid coolant to flow with the air bubbles, wherein said circulating flow of liquid coolant may flow in either of two directions, said flow direction being determined by which direction offers the least internal resistance, and wherein said two hollow tubes connecting the heat sink and the radiator are connected at positions of the same height so that the coolant can flow in either of the two directions, wherein a heat transmission promoting member promoting transmission of heat to the liquid coolant is provided in the heat sink.

6. A cooling unit comprising:

a heat receiving unit that receives heat from a body radiating heat;

a radiator unit disposed at a distance from the heat receiving unit and radiating recovered heat;

a liquid coolant transporting heat generated at the heat receiving unit to the radiator; and two distinct hollow tubes disposed so that the liquid coolant circulates between the heat receiving unit and the radiator, each of the hollow tubes forming a separate fluid path between the heat receiving unit and the radiator, the liquid coolant in one tube flowing from the heat receiving unit to the radiator, and the liquid coolant in the other tube flowing from the radiator to the heat receiving unit, a circulating flow of the liquid coolant formed by an elevating force of air bubbles generated from the heat received at the heat receiving unit, the radiator having an air pocket forming one part of the circulation path of the liquid coolant together with the hollow tubes and capable of collecting the air bubbles, wherein the heat receiving unit includes a heat sink forming one part of the circulation path of the liquid coolant together with the hollow tubes and the radiator and having a cross-sectional area larger than a cross-sectional area of each hollow tube so as to be capable of collecting a predetermined amount of the liquid coolant so that a portion of the collected liquid coolant turns into air bubbles and flows into one of the hollow tubes and causes liquid coolant to flow with the air bubbles, wherein said circulating flow of liquid coolant may flow in either of two directions, said flow direction being determined by which direction offers the least internal resistance, and wherein said two hollow tubes connecting the heat sink and the radiator are connected at positions of the same height so that the coolant can flow in either of the two directions, wherein heat removing means for efficiently removing heat from the liquid coolant is provided inside the radiator.

* * * * *